(12) United States Patent
Boyd et al.

(10) Patent No.: US 7,810,513 B1
(45) Date of Patent: Oct. 12, 2010

(54) SUBSTRATE PREPARATION USING MEGASONIC COUPLING FLUID MENISCUS AND METHODS, APPARATUS, AND SYSTEMS FOR IMPLEMENTING THE SAME

(75) Inventors: John M. Boyd, Hillsboro, OR (US); Fritz C. Redeker, Fremont, CA (US); Seokmin Yun, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 865 days.

(21) Appl. No.: 11/240,974

(22) Filed: Sep. 30, 2005

Related U.S. Application Data

(63) Continuation-in-part of application No. 10/261,839, filed on Sep. 30, 2002, now Pat. No. 7,234,477.

(51) Int. Cl.
*B08B 3/04* (2006.01)

(52) U.S. Cl. .................. 134/104.2; 134/59; 134/105; 134/172; 134/902

(58) Field of Classification Search .......... 134/59, 134/104.2, 105, 172, 902
See application file for complete search history.

(56) References Cited

U.S. PATENT DOCUMENTS 6,222,305 B1 * 4/2001 Beck et al. ................ 310/334
6,230,722 B1 * 5/2001 Mitsumori et al. ......... 134/122 R
2002/0096578 A1 * 7/2002 Al-Jiboory ................ 239/102.1
2004/0069319 A1 * 4/2004 Boyd et al. ................ 134/1.3

* cited by examiner

*Primary Examiner*—Michael Barr
*Assistant Examiner*—Jason Heckert
(74) *Attorney, Agent, or Firm*—Martine Penilla & Gencarella LLP

(57) ABSTRACT

An apparatus for preparing a substrate is provided. The apparatus includes a proximity head and a megasonic proximity head. The proximity head is configured to be applied to a substrate frontside and is capable of generating a preparation meniscus on the substrate frontside. The preparation meniscus includes a preparation chemistry that is configured to remove a material defined on the substrate frontside. The megasonic proximity head is configured to be applied to a substrate backside, and is capable of generating a coupling meniscus on the substrate backside. The megasonic proximity head is further capable of imparting megasonic energy to the coupling meniscus. The megasonic energy imparted to the coupling meniscus is configured to enhance a mass transport of the preparation chemistry through a material to be removed on the substrate frontside.

16 Claims, 10 Drawing Sheets

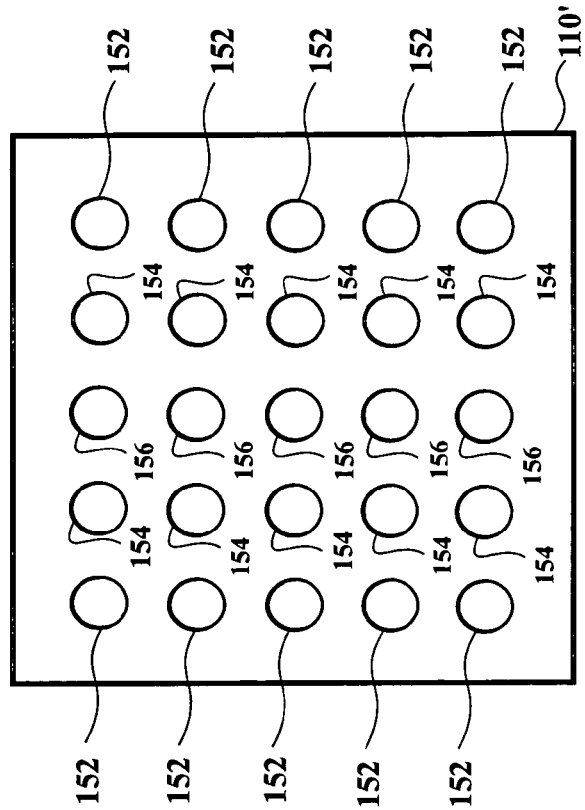
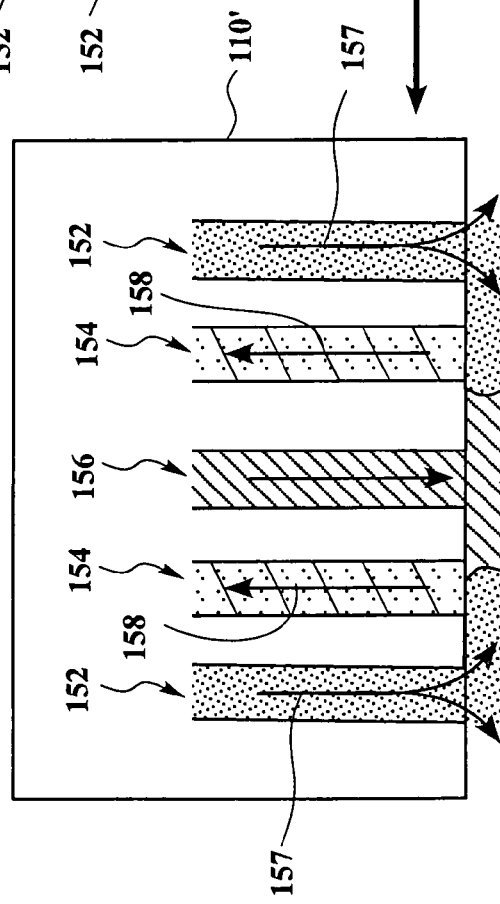
FIG. 4A
FIG. 4B

SUBSTRATE PREPARATION USING MEGASONIC COUPLING FLUID MENISCUS AND METHODS, APPARATUS, AND SYSTEMS FOR IMPLEMENTING THE SAME

CROSS-REFERENCE TO RELATED APPLICATIONS

This application is a continuation-in-part of U.S. patent application Ser. No. 10/261,839, filed on Sep. 30, 2002, now U.S. Pat. No. 7,234,477 and entitled "METHOD AND APPARATUS FOR DRYING SEMICONDUCTOR WAFER SURFACES USING A PLURALITY OF INLETS AND OUTLETS HELD IN CLOSE PROXIMITY TO THE WAFER SURFACES," from which priority under 35 U.S.C. §120 is claimed. The disclosure of this application is incorporated herein by reference in its entirety.

BACKGROUND

The present invention relates generally to substrate preparation and/or cleaning and, more particularly, to systems, apparatus, and methods for improving preparation and/or cleaning of semiconductor substrate front surfaces.

DESCRIPTION OF THE RELATED ART

The fabrication of semiconductor devices involves numerous processing operations. These operations include, for example, dopant implants, gate oxide generation, inter-metal oxide depositions, metallization depositions, photolithography patterning, etching operations, chemical mechanical polishing (CMP), etc. Patterning and etching operations can be used to define features of a semiconductor device in the semiconductor wafer. In the patterning operation, a layer of photoresist material is deposited onto an intermediate layer formed over the semiconductor wafer. Thereafter, the photoresist layer is patterned by photolithography. At this point, the semiconductor wafer is exposed to light filtered by a reticle patterned with the desired integrated circuit layer features. As a result of being exposed, the light impinges upon the surface of the photoresist material, changes the chemical composition of the photoresist material, and creates a number of polymerized photoresist sections. The polymerized photoresist sections are then removed using a solvent, leaving a number of photoresist lines. At this point, the semiconductor wafer is etched. The portions of the underlying layer not protected by the photoresist material are removed, thus forming the desired semiconductor device features in the semiconductor wafer. Prior to proceeding to the next operation, however, the photoresist lines may need to be removed, and semiconductor wafer surfaces may need to be cleaned.

Chemicals can be used in a wet processing operation to remove the photoresist lines. In one approach, the photoresist lines are exposed to chemicals capable of reducing the adhesion at the interface of the photoresist lines and the underlying layer. Removing the photoresist lines using the latter approach requires that batches of semiconductor wafers be placed in tanks filled with such chemicals. Reducing the adhesion at the interface of the photoresist lines and the underlying layer, however, requires the soaking of the semiconductor wafers in the chemicals for an extended period and until the photoresist material is completely soaked. The soaking of batches of semiconductor wafers in tanks filled with chemicals is disfavored, as chemicals can be costly, and the wet operation can be very time consuming.

One way to expedite the removal of the photoresist material is to couple megasonic with the operation of chemical photoresist stripping. Achieving the latter, however, can be very costly as the megasonic equipment and the chemicals implemented for photoresist stripping have to be chemically compatible. Furthermore, applying megasonic to the semiconductor wafer frontside (i.e., the active side or top surface) can undesirably damage the semiconductor devices, thus resulting in defective semiconductor wafers.

After removing of the photoresist lines, but before performing the next process, the semiconductor wafers should be cleaned so that the generated residues and particulate contaminants adhered to the semiconductor wafer surfaces can be removed. Such particulate contaminants can consist of tiny bits of distinctly defined material having an affinity to adhere to the surfaces of the substrate. Examples of particulate contaminants can include organic and inorganic residues, such as silicon dust, silica, slurry residue, polymeric residue, metal flakes, atmospheric dust, plastic particles, and silicate particles, among others. Failure to remove the particulate contaminants from the semiconductor wafer frontside can have detrimental effects on the performance of the semiconductor devices formed thereon, ultimately resulting in defective semiconductor wafers.

In the same manner, failure to adequately and properly clean and process semiconductor wafer backside (i.e., non-active side) can be detrimental. For instance, unfortunately, residues and contaminant particulates on semiconductor wafer backsides can migrate from the semiconductor wafer backside to the semiconductor wafer frontside. For example, the migration may occur during a wet processing step and/or as the substrate is being moved or otherwise handled between the processing or metrology tools. Additionally, any residual fluid on the semiconductor wafer backside can migrate to the substrate frontside, thus re-contaminating the otherwise cleaned semiconductor wafer frontside. Furthermore, the residual fluid may be introduced to the otherwise cleaned and dried substrates in the output cassette. Furthermore, the backside contaminants can undesirably migrate from the tools or steps of one process to tools and steps of the following processes, thus contaminating the subsequent processes. Consequently, the migration of residual fluid can compromise the quality of the substrate preparation operations, and as such, is disfavored.

In view of the foregoing, there is a need for a system, apparatus, and method capable of improving the semiconductor wafer preparation and cleaning operations without substantially damaging the semiconductor devices formed on the semiconductor wafer frontsides.

SUMMARY

Broadly speaking, the present invention fills these needs by providing a method, apparatus, and system for improving a semiconductor substrate preparation and/or cleaning operations without substantially damaging semiconductor devices formed on the substrate frontsides. In one example, the present invention improves substrate preparation and/or cleaning operations by enhancing a mass transport of a preparation chemical to a reaction interface defined between the material to be removed and the substrate frontside. According to one aspect, the mass transport of the preparation chemistry to the reaction interface is achieved by applying megasonic energy to a backside of the substrate and the transmission of the megasonic energy to the reaction interface through a megasonic coupling fluid meniscus and the substrate. In accordance with one aspect, the megasonic coupling fluid meniscus having a lower temperature can be implemented to isolate a higher temperature condition on the substrate frontside (i.e., the process side) from a megasonic coupling proximity head defined on the substrate backside.

It should be appreciated that the present invention can be implemented in numerous ways, including as a process, an apparatus, a system, a device, or a method. Several inventive embodiments of the present invention are described below.

In one embodiment, an apparatus for preparing a substrate is provided. The apparatus includes a proximity head and a megasonic proximity head. The proximity head is configured to be applied to a substrate frontside and is capable of generating a preparation meniscus on the substrate frontside. The preparation meniscus includes a preparation chemistry that is configured to remove a material defined on the substrate frontside. The megasonic proximity head is configured to be applied to a substrate backside, and is capable of generating a coupling meniscus on the substrate backside. The megasonic proximity head is further capable of imparting megasonic energy to the coupling meniscus. The megasonic energy imparted to the coupling meniscus is configured to enhance a mass transport of the preparation chemistry through a material to be removed on the substrate frontside.

According to another embodiment of the present invention, a method for enhancing the mass transport of a chemistry in a material to be removed is provided. The method includes applying the chemistry on the material to be removed and forming a back meniscus on a second side of the substrate. The material to be removed is defined on a first side of a substrate. Megasonic energy is applied to the back meniscus. The megasonic energy is transmitted to an interface defined between the material to be removed and the first side of the substrate through the back meniscus such that the mass transport of the chemistry through the material to be removed is enhanced.

According to yet another embodiment of the present invention, a substrate preparation system is provided. The system includes a proximity head and a megasonic proximity head. The megasonic proximity head includes a resonator and a crystal. The resonator has a first side and a second side and the first side of the resonator faces the substrate backside. The crystal is defined on the second side of the resonator. The vibration of the crystal is configured to generate megasonic energy. The proximity head is configured to be applied to a substrate frontside and is capable of generating a preparation meniscus on the substrate frontside. The preparation meniscus includes a preparation chemistry that is configured to remove a material to be removed defined on the substrate frontside. The megasonic proximity head is configured to be applied to a substrate backside and is capable of generating megasonic energy. The megasonic energy is configured to enhance a mass transport of the preparation chemistry through the material to be removed.

In accordance with still another embodiment of the present invention, an apparatus for isolating a temperature of a process side of a substrate is provided. The apparatus includes a megasonic proximity head that is configured to be applied to a non-process side of the substrate. The megasonic proximity head is capable of generating a coupling meniscus on the non-process side of the substrate. Lowering a temperature of the coupling meniscus is configured to decouple the temperature of the process side of the substrate from the non-process side of the substrate.

The advantages of the present invention are numerous. Most notably, the present invention can substantially reduce undesirable damage to the semiconductor devices formed over the substrate frontside by transmission of the megasonic energy to the interface through the substrate backside and the substrate. Furthermore, megasonic energy is not being applied directly to the semiconductor devices defined on the substrate frontside, thus substantially reducing the possibility of dislodging or damaging the semiconductor features formed therein. Yet further, enhancing the mass transport of the preparation chemistry through the material to be removed requires a lower level of megasonic energy.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 4A shows a top view of a portion of a proximity head in accordance with one embodiment of the present invention.

FIG. 4B illustrates an inlets/outlets pattern of a proximity head in accordance with another embodiment of the present invention.

DETAILED DESCRIPTION

Figure 1A:
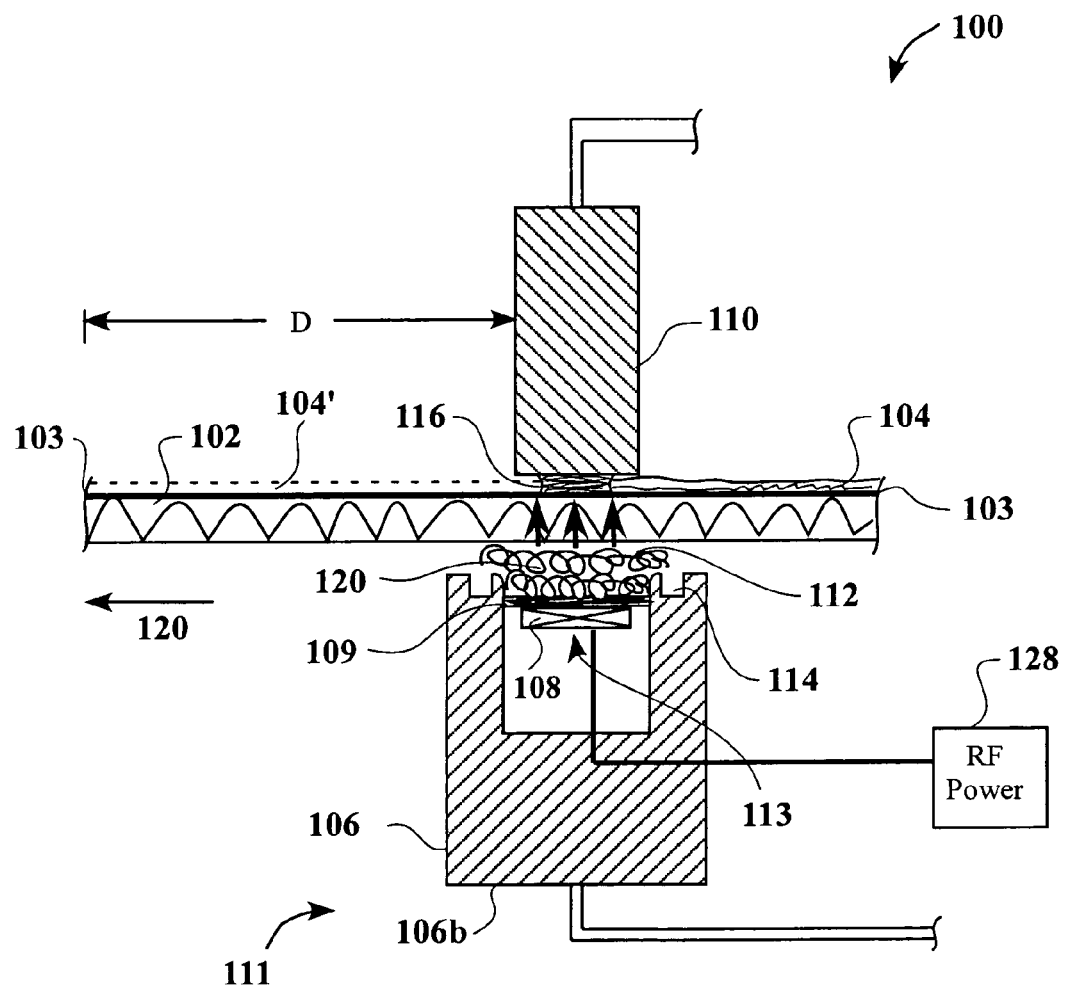
FIG. 1A is a simplified, partial, side view of an exemplary proximity preparation system implementing an exemplary megasonic coupling proximity head, in accordance with one embodiment of the present invention.

An invention capable of improving substrate preparation and/or cleaning operations without substantially damaging semiconductor devices formed on substrate frontsides is provided. In one example, the present invention improves substrate preparation and/or cleaning operations by enhancing a mass transport of preparation chemistry to a reaction interface on the substrate frontside. According to one aspect, the enhancing of the mass transport of the preparation chemistry to the reaction interface is achieved by imparting megasonic energy to the interface through a megasonic coupling fluid meniscus coupled to a backside of the substrate. In one example, the megasonic energy imparted to the reaction interface further assists in breaking a bond or a force between the material to be removed and/or the residues or particulate contaminants, and the substrate frontside at the reaction interface, thus resulting in the removed of the residues, particulate contaminants, and/or the material to be removed.

In one aspect, the megasonic energy imparted by a megasonic coupling proximity head is implemented to enhance the mass transport of the preparation chemistry implemented to prepare the substrate frontside. In one example, the megasonic energy facilitates the moving of the molecules of the preparation chemistry to the interface (herein also referred to as the reaction site) (e.g., the interface between the photoresist layer and the substrate frontside, or the interface between the residue and/or the particulate contaminants and the substrate frontside) and removing of the reaction by-products generated as a result of the chemical reaction between the preparation chemistry and the material being removed from the reaction site. In one instance, implementing the megasonic coupling proximity head of the present invention enhances the mass transport of the chemicals to the reaction side and moving of the reaction by-products from the interface.

According to one embodiment, the megasonic coupling proximity head of present invention faces the substrate backside and substantially opposite a proximity head configured to prepare the semiconductor wafer frontside using a meniscus. The megasonic energy imparted by the megasonic coupling proximity head of the present invention is transmitted to the megasonic coupling fluid meniscus generated by the megasonic coupling proximity head. Thereafter, the megasonic energy is imparted to the substrate backside and the interface. According to one embodiment, meniscus is disclosed in U.S. patent application Ser. No. 10/261,839, filed on Sep. 30, 2002, and entitled "METHOD AND APPARATUS FOR DRYING SEMICONDUCTOR WAFER SURFACES USING A PLURALITY OF INLETS AND OUTLETS HELD IN CLOSE PROXIMITY TO THE WAFER SURFACES," AND is incorporated herein by reference in its entirety.

In one embodiment of the present invention, a cooling fluid (e.g., nitrogen) can be introduced to an inner area of the transducer and the backside of the crystal so as to lower the temperature of the transducer. In another example, a higher temperature of the meniscus being applied to the substrate frontside can be isolated from the transducer using the megasonic coupling fluid meniscus having a lower temperature. In one example, a cooled megasonic fluid can be introduced into the megasonic coupling proximity head. In this manner, the megasonic coupling fluid meniscus having a lower temperature can be implemented to isolate the temperature condition on the substrate frontside (i.e., the process side) from the transducer defined on the substrate backside.

FIG. 1A is a simplified, partial, side view of an exemplary proximity preparation system 100 implementing an exemplary megasonic coupling proximity head 111, in accordance with one embodiment of the present invention. The system 100 includes a proximity head 110, the megasonic coupling proximity head 111, and an RF power supply component 128. In the illustrated embodiment, the proximity head 110 and the megasonic coupling proximity head 111 are bar-shaped and are defined on opposite sides of a semiconductor wafer 102. The proximity head 110 faces a semiconductor wafer frontside 102a while the megasonic coupling proximity head 111 faces a semiconductor wafer backside 102b. While the proximity head 110 and the megasonic coupling proximity head 111 extend the entire diameter of the semiconductor wafer 102, the proximity head 110 and the megasonic coupling proximity head 111 partially cover the semiconductor wafer frontside and backside 102a and 102b, respectively. The proximity head 110 is configured to prepare the semiconductor wafer frontside 102a using a meniscus 116. As used herein, meniscus 116 is the portion of fluids (e.g., preparation chemistry, pre-rinse fluid, IPA vapor, DI water, etc.) defined in a region between the proximity head 110 and the semiconductor wafer frontside 102a.

In one example, the megasonic coupling proximity head 111 is configured to assist the proximity head 110 in preparing the semiconductor frontside 102a. According to one aspect, the semiconductor wafer 102 is configured to be moved in a direction 120 while the megasonic coupling proximity head 111 and the proximity head 110 remain stationary. In the illustrated embodiment, the proximity head 110 is configured to strip a photoresist layer 104 from over the semiconductor wafer 102. In another example, the proximity head 110 can be configured to remove any desired layer of material and/or residues and particulate contaminants from over the semiconductor wafer frontside 102a.

As can be seen, a portion 104' of the photoresist layer 104 has already been removed from over the semiconductor wafer frontside 102a, as depicted by the dotted lines. The portion 104' corresponds to a processed section D of the semiconductor wafer frontside 102a. As described in more detail below, the processing of the section D by the proximity head 110 has been assisted by the megasonic coupling proximity head 111 being applied to the semiconductor wafer backside 102b.

In one example, the meniscus 116 includes a preparation chemistry configured to strip the photoresist layer 104 from over the semiconductor wafer frontside 102a. According to one embodiment, the megasonic energy imparted by the megasonic coupling proximity head 111 onto the semiconductor backside 102b is configured to enhance the mass transport of the preparation chemistry through the photoresist layer 104 and to an interface 103 (i.e., the interaction site) defined between the photoresist layer 104 and the semiconductor wafer frontside 102a. Mass transport refers to the diffusion of chemicals being used to remove the residues, particulate contaminants, and/or a layer of material through the material to be removed and down to an interface defined between the material to be removed and an underlying layer. The mass transport of the preparation chemistry further includes the removing of the by-products generated as a result of the chemical reaction between the materials to be removed and/or the particulate contaminants from the interface. However, as is described in more detail below, the chemical reaction between the preparation chemistry and the photoresist layer 104 can be a mass transport limited reaction. That is, the preparation chemistry can diffuse through the photoresist layer 104 (i.e., the material to be removed) and can react with the photoresist material (i.e., the material to be removed), generating by-products. The generated by-products, however, cover the photoresist layer (i.e., the material to be removed). As such, unless the generated by-products covering the photoresist layer are removed from the interface, the covered portions of the material to be removed cannot enter into chemical reaction with the preparation chemistry. Consequently, undesirably, the rate of chemical reaction is reduced. Accordingly, the megasonic coupling proximity head of the present invention is implemented to enhance the mass transport in a mass transport limited reaction.

The illustrated megasonic coupling proximity head 111 includes a housing 106 and a transducer 113. A top surface 106a of the housing 106 includes a weir 114 and faces the semiconductor wafer backside 102b. A megasonic fluid (not shown in FIG. 1A) is introduced into the housing 106 and ultimately into a well 120, thus forming the megasonic coupling fluid meniscus 112. In one example, as the megasonic coupling fluid meniscus 112 is formed and as the semiconductor wafer backside 102b gets closer to the megasonic coupling fluid meniscus 112, the megasonic coupling fluid 112 acts as a seal, coupling the semiconductor wafer backside 102b to the megasonic coupling proximity head 111. Additional information with respect to the megasonic coupling fluid 112 is provided below with respect to FIGS. 1B-4.

The transducer 113 includes a resonator 109 and a crystal 108 defined on an inner surface of the resonator 109. In one exemplary embodiment, the vibrations of the crystal 108 and thus the transducer 113 create sonic energy in the megasonic coupling fluid meniscus 112. The sonic agitation generated by the transducer 113 is thus imparted to the semiconductor wafer backside 102b through the megasonic coupling fluid meniscus 112, and ultimately to the interface 103. The coupled megasonic coupling fluid meniscus enhances the mass transport of the preparation chemistry through the photoresist layer 104 to the interface as well as assisting in the breaking of the bond between the photoresist layer and the semiconductor wafer frontside 102a at the interface 103.

Figure 1B:
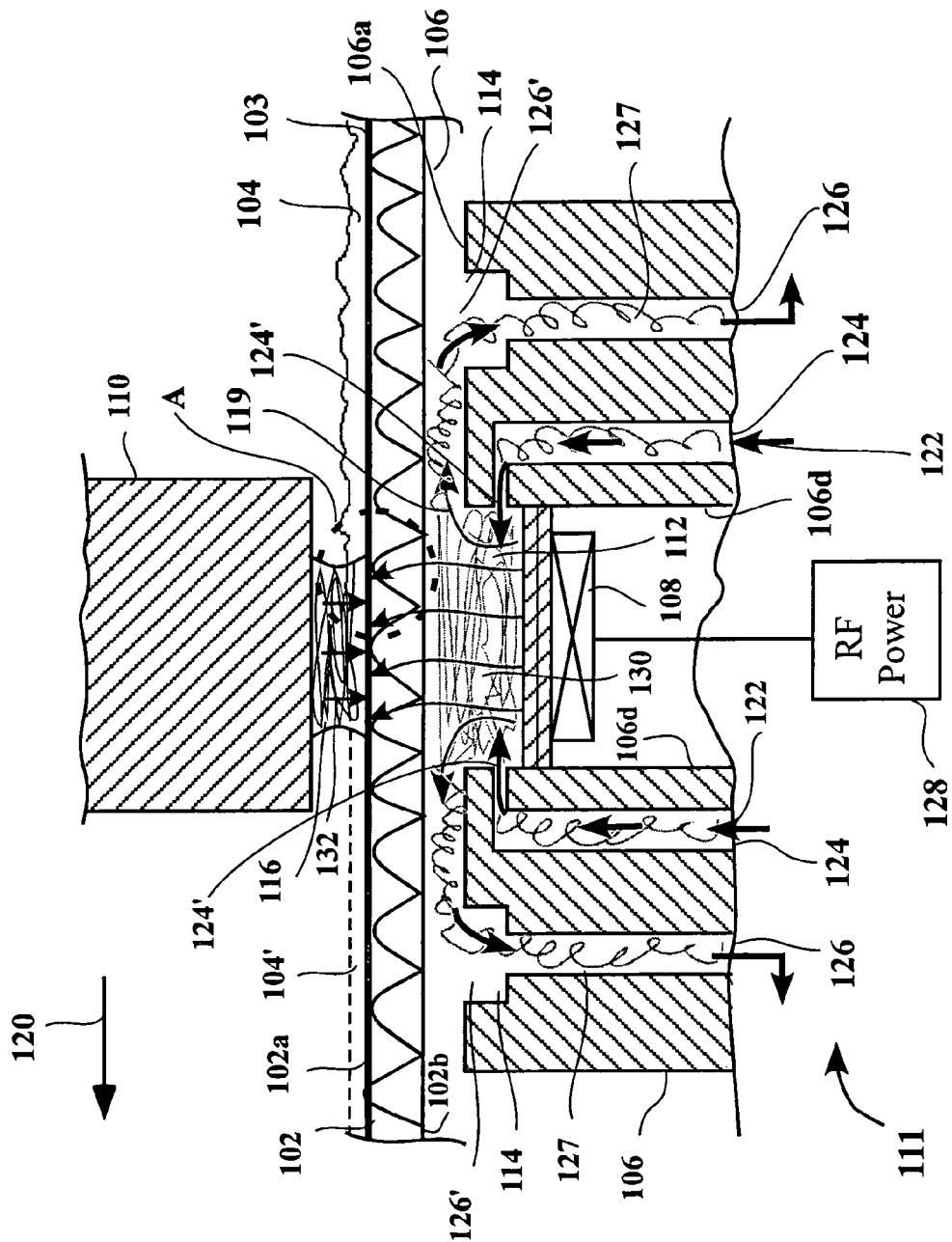
FIG. 1B is a simplified, partial, magnified, cross sectional view of the proximity preparation system depicted in FIG. 1A, in accordance with one embodiment of the present invention.

FIG. 1B is a simplified, partial, magnified cross sectional view of the proximity preparation system 100 depicted in FIG. 1A, in accordance with another embodiment of the present invention. According to one example, the housing 106 is constructed from a chemically inert material (e.g., PET, plastics, polyurethane, etc.). The exemplary housing 106 of the megasonic coupling proximity head 111 includes channels 124, which extend from a bottom surface 106b of the housing 106 to a top surface 106a of the housing 106.

The megasonic fluid is introduced into the housing 106 through inlets 122 of the channels 124, and ultimately into the well 120 formed between an outer surface of the resonator 109, sidewalls 106d of the housing 106, and the top surface 106a of the housing 106, thus forming the megasonic coupling fluid meniscus 112. As can be seen, the megasonic fluid meniscus 112 is further confined by the semiconductor wafer backside 102b. As such, the megasonic coupling fluid meniscus 112 seals the megasonic coupling proximity head 112 to the semiconductor wafer backside 102b. One of ordinary skill in the art must appreciate that although in the illustrated embodiment the resonator 109 extends between the inner sidewalls 106d of the housing 106, in another embodiment, the resonator 109 can also extend along the inner sidewalls 106d of the megasonic coupling proximity head 111 so that megasonic energy can be imparted to the megasonic fluid while the megasonic fluid is in the channels 124 and before being diverted into the well 120. Furthermore, although in the illustrated embodiment the megasonic coupling proximity head 111 includes a weir 114, in another embodiment, a weir may not be included so long as the tolerance required to control suction of the megasonic coupling fluid meniscus can be achieved.

However, as shown by arrows 119, the megasonic coupling fluid meniscus 112 can over flow over the top surface 106a of the housing 106 and into a weir 114. Thereafter, the overflowed megasonic coupling fluid meniscus 112 can be expelled from the housing 106 and the weir 114 through outlets 126 of channels 127 extending from the weir 114 to the bottom surface 106b of the housing 106. In one example, the megasonic fluid is deionized water. Of course, in another embodiment, the megasonic fluid can be any suitable fluid so long as the function of imparting the megasonic energy to the interface 103 can be achieved (chemistry, etc.).

The crystal 108 secured to the inner surface of the resonator 109 is in communication with the RF power supply component 128 that is configured to provide the crystal 108 electrical energy along the direction of arrows 130. In one example, the crystal 108 is bonded to the inner surface of the resonator 109. However, in another embodiment, the crystal 108 can be secured to the inner surface of the resonator 109 using any appropriate technique.

According to one example, as electrical energy is applied to the crystal 108, the crystal 108 starts imparting energy to the megasonic coupling fluid meniscus 112. The energy imparted to the megasonic coupling fluid meniscus 112 is in turn passed through the semiconductor wafer backside 102b and the semiconductor wafer 102 to the interface 103. At times, the megasonic energy can also be imparted to the semiconductor wafer frontside 102a and the meniscus 116. In this manner, the mass transport of the preparation chemistry is enhanced even though the megasonic energy is not being directly imparted to the photoresist layer 104.

The megasonic coupling fluid meniscus 112 defined between the megasonic coupling proximity head 111 and the semiconductor wafer backside 102b, and is applied onto the semiconductor wafer backside in a stable and controllable manner. In one embodiment, the megasonic coupling fluid meniscus 112 may be confined by a constant application and removal of the megasonic fluid. According to one example, surface tension gradient technology (STG) such as IPA vapor can be implemented to define the megasonic coupling fluid meniscus 112. For instance, IPA can be applied so as to maintain an encapsulated area of megasonic fluid above or below a surface, or between surfaces. The vacuum removes the IPA and the megasonic fluid along with any residues and/or particulate contaminants that may reside on the semiconductor wafer backside 102b.

It must be noted that although in the illustrated embodiment a single crystal 108 is shown to be bonded to the inner surface of the resonator 109, in another embodiment, any appropriate number of crystals 108 can be implemented so long as the function of generating megasonic energy can be achieved. According to one aspect, the transducer 113 of the present invention can include an array of staggered crystals. Additional information with respect to implementing array of staggered crystals is provided in U.S. patent application Ser. No. 10/371,679, filed on Feb. 20, 2003, having inventors Tom, Anderson and John M. Boyd, and entitled "DISTRIBUTION OF ENERGY IN A HIGH FREQUENCY RESONATING WAFER PROCESSING SYSTEM." The disclosure of this Application, which is assigned to Lam Research Corporation, the assignee of the subject application, is incorporated herein by reference.

In one embodiment, the crystal 108 may provide a movement frequency between about 20 KHz and 500 KHz. In another implementation, the megasonic frequency can range between approximately about 0.5 MHz and about 2 MHz. In one example, the crystal 108 is a piezoelectric crystal. It must be appreciated by one of ordinary skill in the art that the piezoelectric crystals can be made of any appropriate piezoelectric material (e.g., piezoelectric ceramic, lead zirconium tintanate, piezoelectric quartz, gallium phosphate, etc.). In a like manner, the resonator 109 can be made of any appropriate material (e.g., ceramic, silicon carbide, stainless steel, aluminum, quartz, etc.). Additionally, one having ordinary skill in the art must appreciate that a thickness of the piezoelectric crystal 108 depends on the design of the crystal 108, mechanical strength of the crystal material, and type of crystal material. In one example, the thickness of the piezoelectric crystals is configured to range between approximately about 1 mm and about 6 millimeter, and a more preferred range of approximately about 2 mm and 4 mm and most preferably between approximately about 1 mm to approximately about 2 millimeters. In another embodiment, wherein the crystals are ceramic type crystals, the thickness of the crystals is configured to range between approximately about 1 mm to about 4 mm.

Preparation of the semiconductor wafer frontside 102 causing the proximity head 110 and the application of the megasonic energy to the semiconductor backside 102b can be advantages for several reasons. For instance, megasonic energy is not being applied directly to the semiconductor devices defined on the semiconductor wafer frontside, thus substantially reducing the possibility of dislodging or damaging the semiconductor features formed therein. Furthermore, enhancing the mass transport of the preparation chemistry through the material to be removed requires a lower level of megasonic energy. Thus, in one aspect, megasonic energy having a level lower than that of the damage threshold can be imparted to the backside of the semiconductor wafer so as to enhance chemical reaction at the reaction site defined on the semiconductor wafer frontside 102a. In one example, the level of megasonic energy being applied onto the semiconductor backside 102b can range between about 0.1 watt per square centimeter ($W/cm^2$) to about 10 $W/cm^2$, and more specifically, between about 0.1 $W/cm^2$ and about 1 $W/cm^2$.

Of course, the level of megasonic energy being implemented can be higher if the megasonic coupling proximity head is being implemented to facilitate mass transport of the preparation chemistry on a substrate frontside having patterns that are not sensitive to the megasonic energy, or a substrate frontside that is not patterned. Accordingly, the megasonic coupling proximity head of the present invention can be implemented to clean the frontside of the semiconductor wafers depending on the topography on the semiconductor wafer or the process being implemented.

Figure 1C:
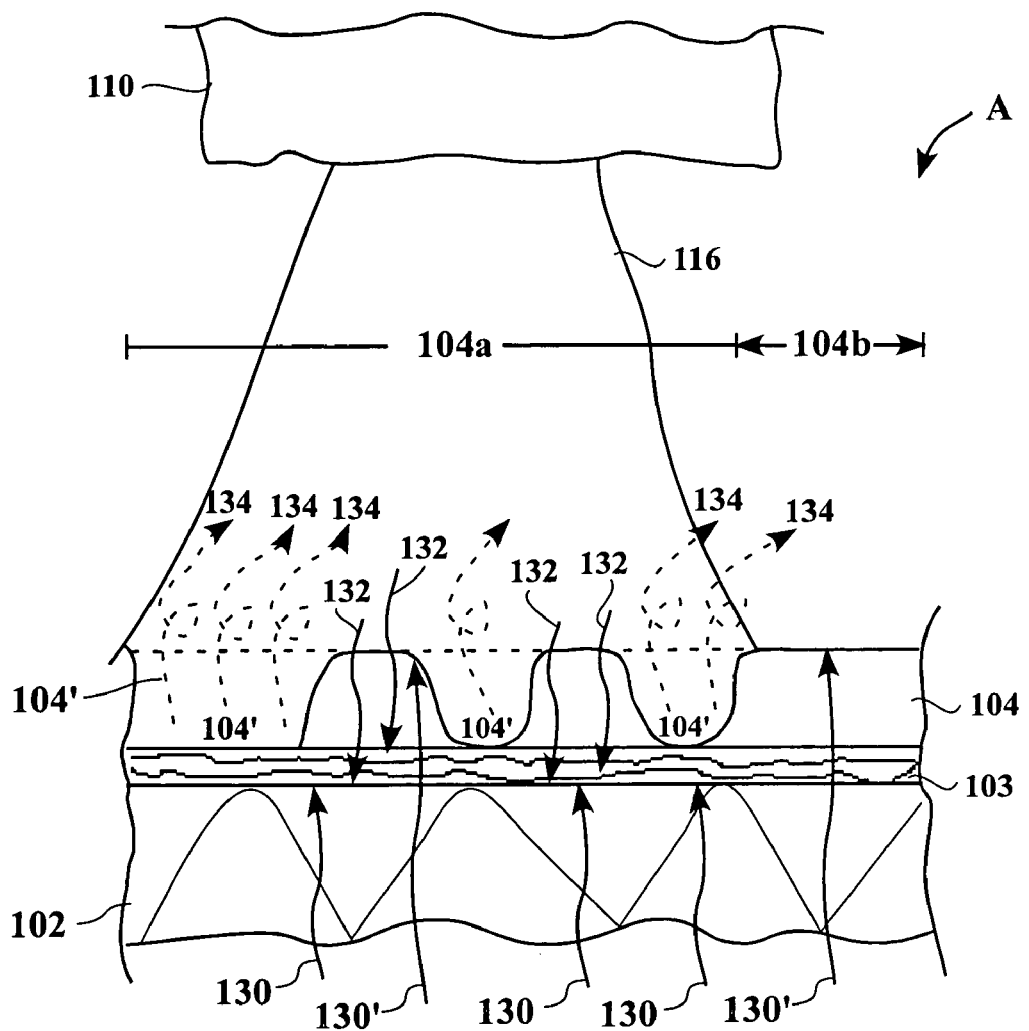
FIG. 1C is a simplified magnification of a region A shown in FIG. 1B, in accordance with yet another embodiment of the present invention.

FIG. 1C is the simplified, partial, magnified, cross sectional view of a region A shown in FIG. 1B, illustrating the mass transport of the preparation chemistry through the photoresist layer 104, in accordance with one embodiment of the present invention. As shown, a section 104a of the photoresist layer 104 is being processed by the meniscus 116 while the section 104b has not yet been exposed to the meniscus 116. Portions 104' of the section 104a have been removed (as shown by the dotted lines and dotted arrows 134), whereas certain portions of the section 104a have remained intact. Nonetheless, by the time the front meniscus 116 has passed over the section 104a of the photoresist 104, the photoresist material in the section 104a have been removed.

As shown, the semiconductor wafer 102 attenuates portions of the megasonic energy imparted by the megasonic coupling proximity head 111 of the present invention. Specifically, the semiconductor wafer 102 has attenuated the megasonic energy illustrated by arrows 130 at the interface 103, while the megasonic energy illustrated by arrows 130' have passed through the interface 103 and have reached the photoresist layer 104. This is beneficial because the level of megasonic energy imparted to the semiconductor wafer frontside 102a is below the damage threshold, thus preventing damaging of the semiconductor devices.

Figure 1D:
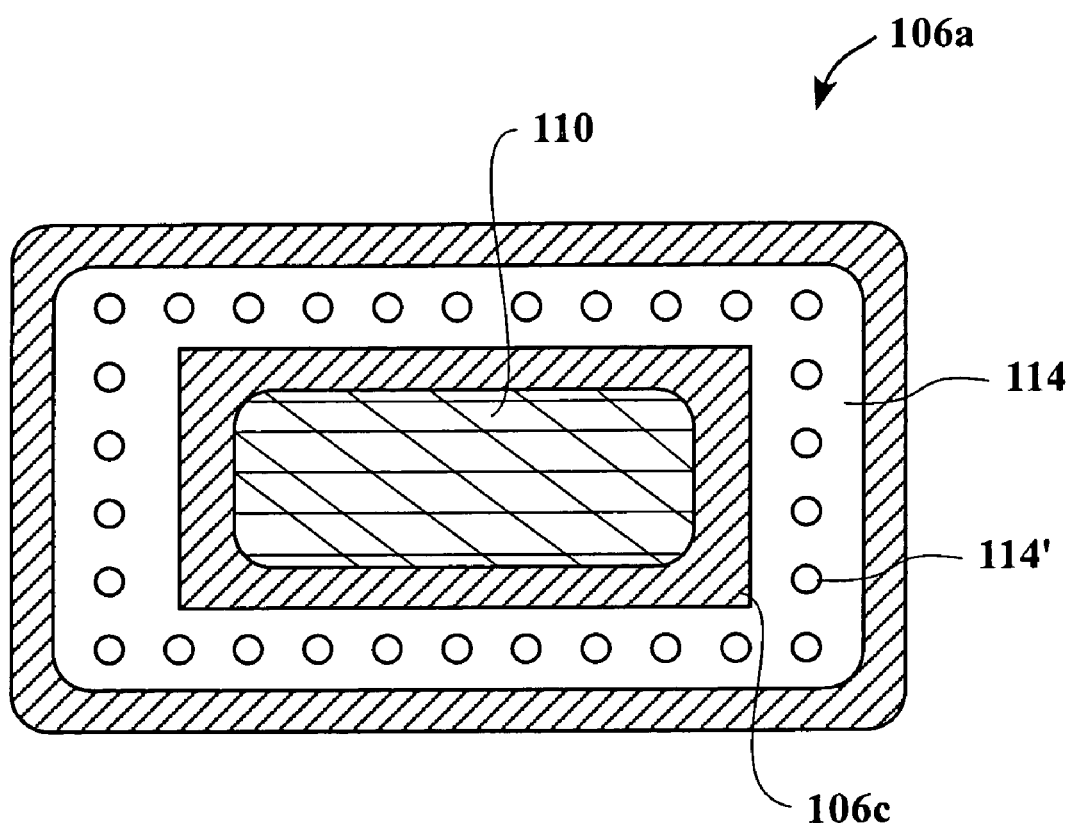
FIG. 1D is a simplified top view of an exemplary megasonic coupling proximity head, in accordance with still another embodiment of the present invention.

FIG. 1D is a simplified top view of an exemplary megasonic coupling proximity head, in accordance with on embodiment of the present invention. In the illustrated embodiment, the top surface 106a of the megasonic coupling proximity head 111 has a rectangular shape. Of course, in another embodiment, the top surface of the megasonic coupling proximity head 111 can have any appropriate shape so long as the function of enhancing the mass transport of the meniscus through the material to be removed can be achieved. A plurality of vacuum holes 114' are defined in the weir 114. In one example, the vacuum holes 114 are used to evacuate the megasonic coupling fluid meniscus 112 from the well 120. In another embodiment, the megasonic coupling fluid meniscus 112 can be removed while using STG to confine the meniscus 112 to a specific region.

Figure 2:
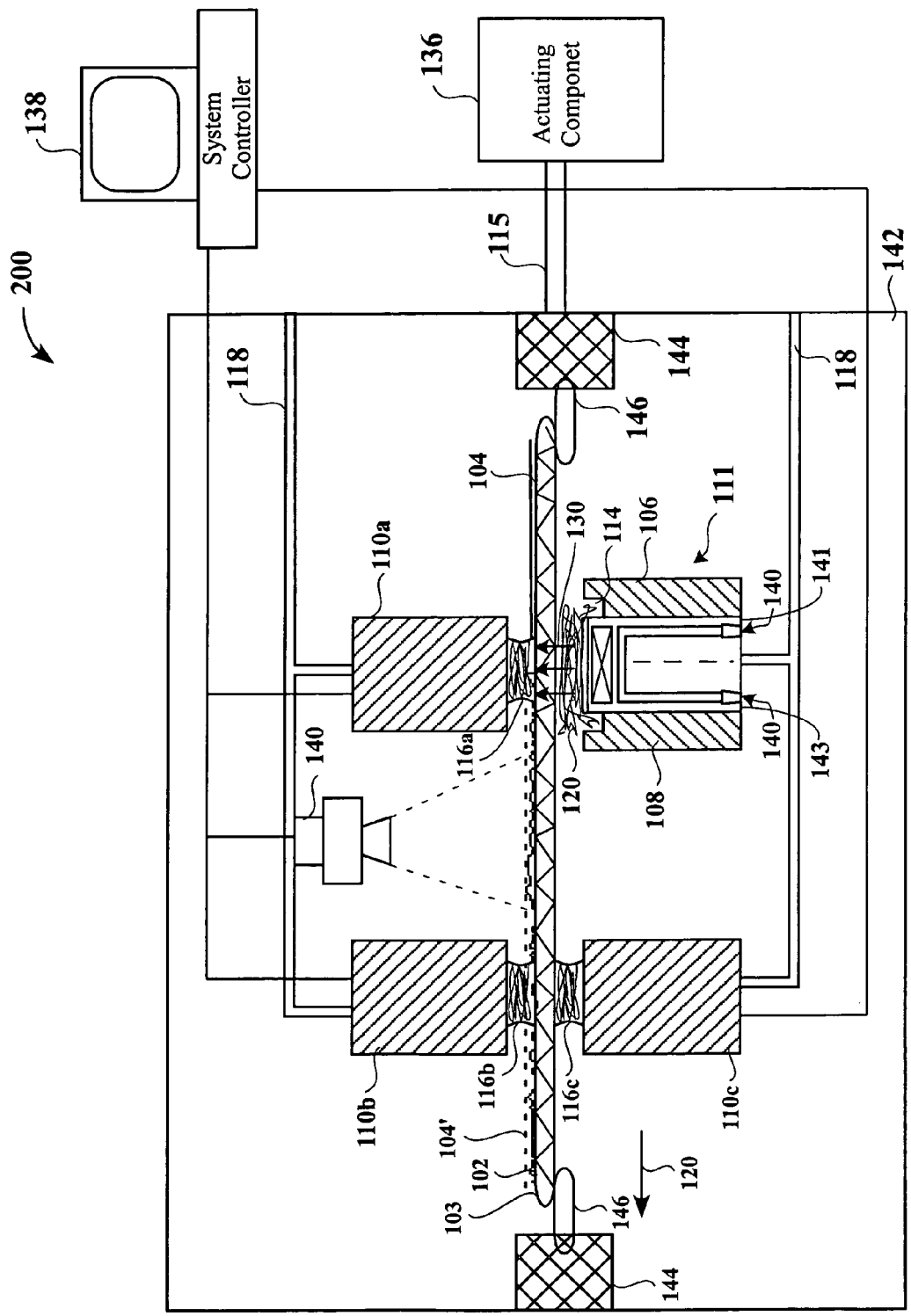
FIG. 2 depicts an exemplary semiconductor wafer preparation system implementing an exemplary megasonic coupling proximity head in conjunction with a two-bar-type proximity head apparatus, in accordance with still another embodiment of the present invention.

Reference is made to FIG. 2 depicting an exemplary semiconductor wafer preparation system 200 implementing yet another exemplary megasonic coupling proximity head in conjunction with a two-bar-type proximity head apparatus preparation, in accordance with one embodiment of the present invention. The system 200 includes a chamber 142, a system controller 138, and an actuating component 136. According to one aspect, the system controller 138 controls the operations of a leading proximity head 110a, the megasonic coupling proximity head 111, a trailing proximity head 110b, and a back proximity head 110c.

In accordance with one aspect of the present invention, the megasonic coupling proximity head 111 is configured to assist the leading proximity head 110a in stripping the photoresist layer 104 from over the semiconductor wafer frontside 102a. Comparatively, the trailing proximity head 110b and the back proximity head 110c are configured to respectively rinse and dry the semiconductor wafer frontside 102a subsequent to the removal of the photoresist layer 104 and the backside 102b subsequent to the cleaning of the backside 102b by the megasonic coupling proximity head 111. Of course, in another embodiment, the leading proximity head 110a can be implemented to dislodge and remove residues and particulate contaminant from over the semiconductor wafer frontside 102a.

As can be seen, the leading and trailing proximity heads 110a and 110b are defined consecutively and, are secured to an inner sidewall of the chamber 142 by a corresponding railing 118. In the same manner, the back proximity head 110c and the megasonic coupling proximity head 111 are defined consecutively and are secured to the inner wall of the chamber by the railing 118. The trailing proximity head 110b and the back proximity head 110c are defined opposite one another with the trailing proximity head 110b being defined proximate to the semiconductor wafer frontside 102a and the backside proximity head 110c being defined proximate to the semiconductor wafer backside 102b. In the same manner, the leading proximity head 110a and the megasonic coupling proximity head 111 are defined opposite one another with the leading proximity head 110a being proximate to the semiconductor wafer frontside 102a and the megasonic coupling proximity head 111 being proximate to the semiconductor wafer backside 102b. Preferably, the pair of trailing and backside proximity heads 110b and 110c, as well as the pair of leading proximity head 110a and the megasonic coupling proximity head 111 are applied onto the frontside 102a and backside 102b of the semiconductor wafer 102, substantially simultaneously.

One of ordinary in the art must recognize and appreciate that although in the illustrated embodiment one pair of proximity head and one pair of proximity head-megasonic coupling head have been implemented, in a different embodiment, any appropriate number of proximity heads can be implemented (e.g., one, two, three, etc.). Furthermore, although in the illustrated embodiment the leading and trailing proximity heads 110a and 110b are supported by the single railing 118, and the back proximity head 110c and the megasonic coupling proximity head 111 are supported by the single railing 118, in another embodiment, each of the leading and trailing proximity heads 110a and 110b, the back proximity head 110c, and the megasonic coupling proximity head 111 can be supported in any appropriate configuration (e.g., each connected to the sidewall by a respective railing, etc.).

In the illustrated embodiment, the railings 118, and thus the respective proximity heads and megasonic coupling proximity head are configured to be fixed. However, in a different embodiment, the pair of trailing and back proximity heads 110b and 110c and the pair of leading proximity head 110a and megasonic coupling proximity head 111 can be configured to move within the chamber 104 so long as the megasonic coupling proximity head 111 can assist in the mass transport of the preparation chemistry through the material being removed. Additionally, in the illustrated embodiment, the semiconductor wafer 102 does not rotate, as the entire frontside and backside 102a and 102b of the semiconductor wafer 102 are being traversed and processed by the leading and trailing proximity heads, back proximity head 110, and the megasonic coupling proximity head 111.

With continued reference to FIG. 2, the carrier 144 is coupled to the actuating component 136 via an arm 115. In one example, the carrier 144 is a rectangular flat surface made of a composite material (e.g., polycarbonate, coated carbon fiber, quartz, aluminum, stainless steel, etc.). A circular opening in the carrier 144 forms an inner rim configured to hold the semiconductor wafer 102 to be prepared. In one example, the semiconductor wafer 102 is supported by the plurality of support members 146 secured to the inner rim of the carrier 144. In one preferred embodiment the support members are pins.

One of ordinary skill in the art must appreciate that although in the illustrated embodiment the carrier 144 has a flat rectangular surface, in another embodiment, the carrier 144 may have any shape suitable for holding and processing the semiconductor wafer 102. Additional information with respect to the carrier 144 and the supporting members 146 is provided in U.S. application Ser. No. 11/241,045, filed on even date herewith having inventors Katrina Mikhaylichenko, Kenneth Dodge, Mikhail Korolik, Michael Ravkin, John M. de Larios, and Fritz C. Redeker, and entitled "SUBSTRATE PROXIMITY DRYING USING IN-SITU LOCAL HEATING OF SUBSTRATE AND SUBSTRATE CARRIER POINT OF CONTACT, AND METHODS, APPARATUS, AND SYSTEMS FOR IMPLEMENTING THE SAME." The disclosure of this Application, which is assigned to Lam Research Corporation, the assignee of the subject application, is incorporated herein by reference.

In operation, the substrate frontside and backside 102a and 102b are prepared as the carrier 144 and thus the semiconductor wafer 102 are transported horizontally in the movement direction 120 within the chamber 142. The semiconductor substrate 102 is transported through the pair of proximity leading proximity head 110a and megasonic coupling proximity head 111 as well as the pair of trailing and back proximity heads 110b and 110c. The megasonic coupling fluid meniscus 112 of the megasonic coupling proximity head 111 assists the preparation of the frontside 102a by the meniscus 116a. Additionally, the frontside and backside 102a and 102b are prepared (e.g., rinsed and dried) by menisci 116b and 116c, respectively. In one example, the megasonic coupling fluid meniscus 112 is configured to prepare the backside 102b by dislodging and removing the residues and particulate contaminants thereon.

The system controller 134 is implemented to manage and monitor the actuating component 136 and the RF power component during operation. In one example, the system controller 134 can be a computer system. According to one embodiment, the actuating component 114 provides the system controller 138 with feedbacks as to selected parameters. In one embodiment, the actuating component 136 can be a motor, however, in a different embodiment, the actuating component 136 can be any component capable of moving the carrier 144 within the chamber 142. Furthermore, one of ordinary skill in the art must appreciate that different mechanics and engineering can be implemented to move the carrier 144 and thus the semiconductor wafer 102 during operation.

In one aspect of the present invention, an in-situ integrated unit such a sensor 140 can be coupled to the railing 118, between the leading proximity head 110 and trailing proximity head 110b so as to ensure the completion of the photoresist removal. In this manner, after the leading proximity head 110a has prepared the semiconductor wafer frontside 102a and removed the photoresist layer 104, the sensor 140 can inspect each portion of the semiconductor wafer frontside 102a. Of course, the sensor 140 provides the control system 134 with feed back as to whether the removal of the photoresist layer 104 or the residue and particulate contaminants have been achieved properly. According to another example, the sensor 140 can be an integrated unit within the trailing proximity head 110b. In one aspect, the sensor 140 can use different techniques to ensure the sufficient removal of the photoresist layer 104 (e.g., broad band spectroscopy, interferometry, vision system, etc.).

According to one example, a sufficient amount of energy should be applied to the transducer 113 to generate the megasonic energy. As a result, a significant amount of heat can be generated at the transducer 113. Undesirably, the heat can degrade the bond between the resonator 109 and the crystal 108, thus preventing the transducer 113 from operating properly. Thus, in one embodiment of the present invention, a cooling fluid (e.g., nitrogen) can be introduced to an inner area of the transducer 113 and the backside of the crystal 108 through an inlet 141. The cooling fluid can thereafter be expelled using an outlet 143.

Figure 3A:
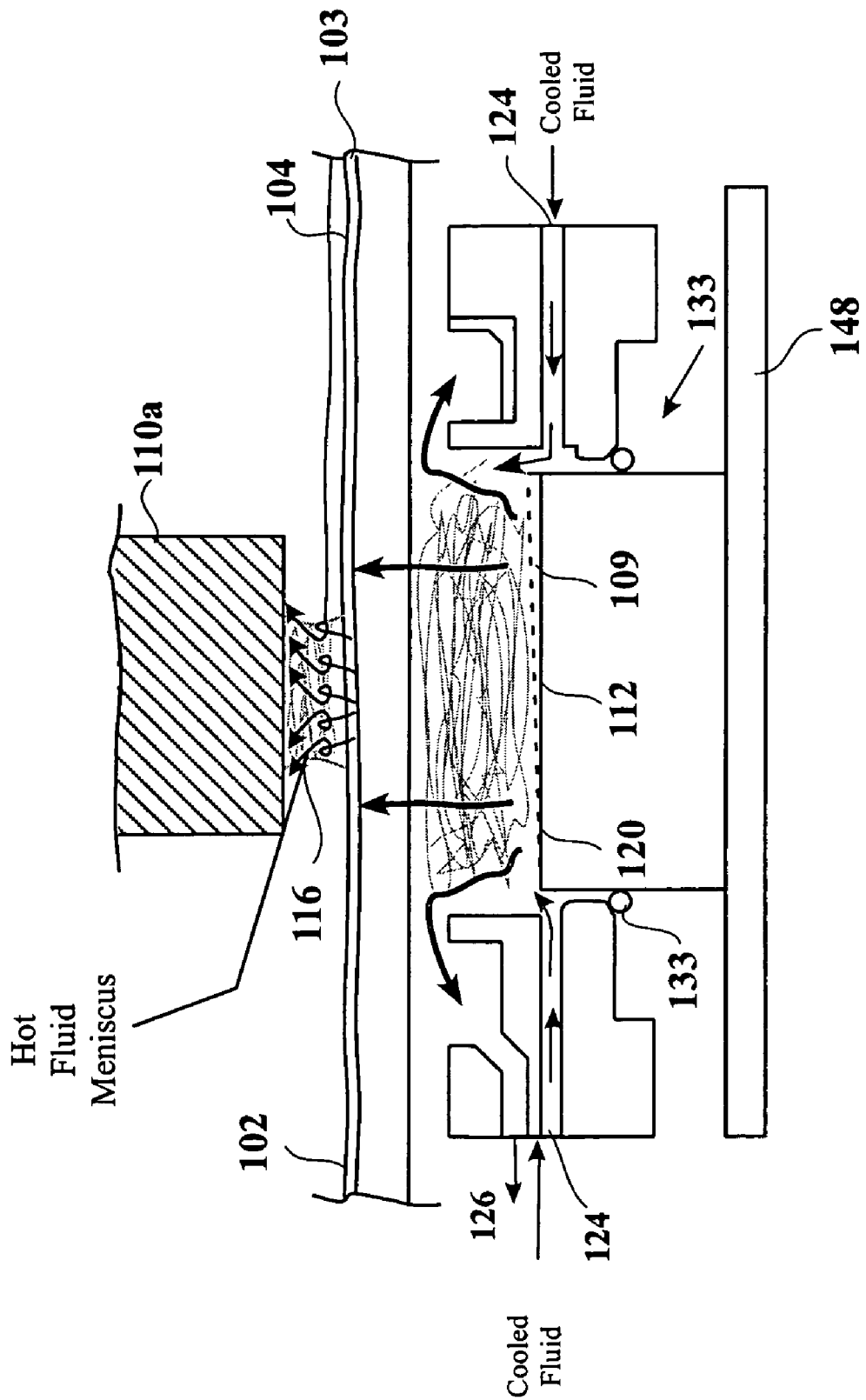
FIG. 3A is a simplified cross sectional view of an exemplary megasonic coupling proximity head, in accordance with another embodiment of the present invention.

Proceeding to FIG. 3A, a simplified cross sectional view of yet another embodiment of the megasonic coupling proximity head of the present invention is illustrated, in accordance in one aspect of the present invention. According to one example, the preparation of the semiconductor wafer frontside 102a can be enhanced by using the meniscus 116 having a higher temperature. However, the higher temperature of the meniscus 116 can degrade the bonding between the resonator and the crystal in the transducer. Accordingly, in one embodiment, the temperature of the megasonic coupling fluid meniscus 112 can be controlled so as to decouple the meniscus 116 having a higher temperature from the transducer 113. In one example, a cooled fluid can be introduced into the megasonic coupling proximity head so as to decouple the higher temperature of the meniscus 116 from the transducer 113. Cooled megasonic fluid can be introduced into the apparatus 111 through the inlets 124 and be diverted into the well 120, forming the megasonic coupling fluid meniscus 112. Of course, due to the cool temperature of the megasonic fluid being introduced, the resulting megasonic coupling fluid meniscus 112 also has a lower temperature. In this manner, the megasonic coupling fluid meniscus 112 can be implemented to isolate the temperature condition on the semiconductor wafer frontside (i.e., the process side) from the transducer 113.

In the illustrated embodiment, the resonator 109 of the transducer 113 is defined at an angle with respect to the semiconductor wafer backside 102b. In one example, the angle between the resonator 109 and the backside 102b can be adjusted by adjusting an angle plate 148. For instance, by adjusting the angle plate 148, a distance between the resonator 109 and the backside 102b can be changed. As shown in the illustrated embodiment, the angle of the resonator 109 is reduced as the semiconductor wafer 102 is inserted between the proximity head 110a and the megasonic coupling proximity head 111', as illustrated by the dotted line.

Figure 3B:
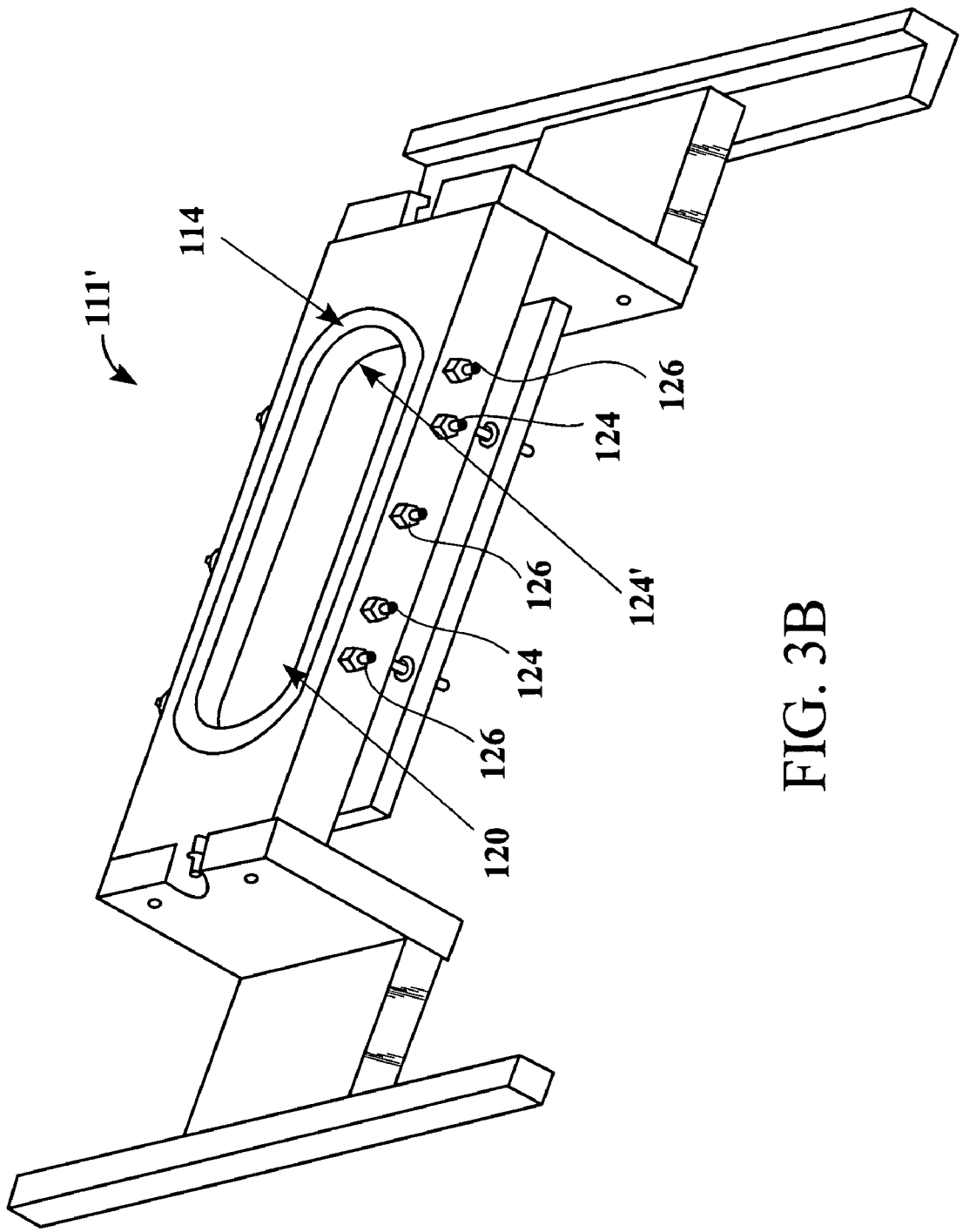
FIG. 3B is a top view of an exemplary megasonic coupling proximity head shown in FIG. 3A, in accordance with another embodiment of the present invention.
Figure 3C:
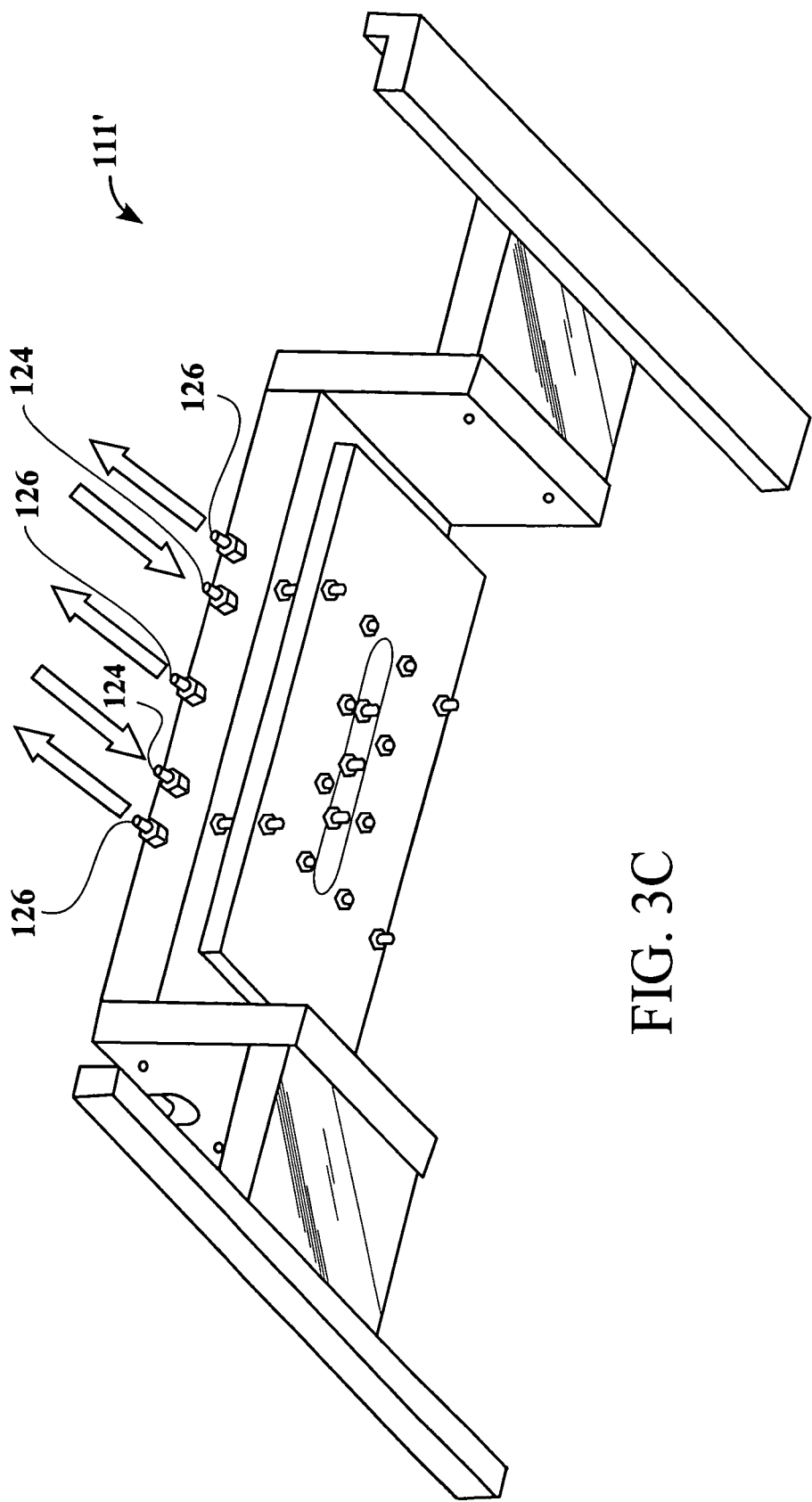
FIG. 3C is a bottom view of an exemplary megasonic coupling proximity head shown in FIG. 3A, in accordance with another embodiment of the present invention.

FIG. 3B is a top view of an exemplary megasonic coupling proximity head 111' shown in FIG. 3A, in accordance with another embodiment of the present invention. In the illustrated embodiment, megasonic fluid is configured to be introduced into the apparatus 111' through the inlets 124 so as to fill the well 120 and form the megasonic coupling fluid meniscus 112. Overflowed megasonic coupling fluid meniscus is configured to be diverted to the weir 114 and be eliminated from the apparatus through the outlets 126. In one example, the overflowed megasonic coupling fluid meniscus 112 is eliminated by vacuum. The bottom view of the megasonic fluid apparatus 111' is shown in FIG. 3C, in accordance with one embodiment of the present invention. As can be seen, megasonic fluid is introduced through inlets 124 and overflowed megasonic coupling fluid meniscus is eliminated through the outlets 126.

One of ordinary skill in the art must appreciate that although in the illustrated embodiments megasonic fluid is introduced through two inlets 124, in another embodiment, any appropriate number of inlets can be implemented to introduce the megasonic fluid into the apparatus 111'. Furthermore, although in the illustrated embodiments three outlets 126 are shown, in another embodiment, any suitable number of outlets can be implemented to dispose of the megasonic fluid from the apparatus 111'.

According to one embodiment of the present invention, the megasonic coupling proximity head can be incorporated in a clustered substrate processing system. For instance, after a substrate frontside and/or backside has been pre-processed in an etching chamber, a chemical vapor deposition system, a chemical mechanical polishing (CMP) system, etc., the megasonic coupling proximity head of the present invention can assist in preparation of the substrate frontside and backside. Thereafter, the semiconductor wafer backside and/or frontside can be post-processed in an etching chamber, a chemical vapor deposition (CVD) system, physical vapor deposition (PVD) system, electrochemical deposition (ECD) system, an atomic layer deposition (ALD) system, a lithographic processing system (including coater and stepper) module, etc.

Yet further, in one exemplary implementation, the megasonic coupling proximity head of the present invention can be implemented in a clustered substrate cleaning apparatus that may be controlled in an automated way by a control station. For instance, the clustered preparation apparatus may include a sender station, a proximity head assisted by a megasonic coupling proximity head of the present invention, and a receiver station. Broadly stated, substrates initially placed in the sender station are delivered, one-at-a-time, so as to be prepared by the proximity head and the megasonic coupling proximity head of the present invention. After being prepared, substrates are then delivered to the receiver station for being stored temporarily. One of ordinary skill in the art must appreciate that in one embodiment, the clustered cleaning apparatus can be implemented to carry out a plurality of different substrate preparation operations (e.g., cleaning, etching, buffing, etc.).

In an exemplary proximity system of the present invention, preparing the substrate surfaces using a meniscus of an exemplary proximity head is described in the following figures.

One of ordinary skill in the art must appreciate that any suitable type of system with any suitable type of proximity head that can generate a fluid meniscus can be used with the embodiments of the present invention described herein.

FIG. 4A illustrates an exemplary proximity head 110' performing a substrate processing operation, in accordance with one embodiment of the present invention. The proximity head 110', in one embodiment, stays in place while the carrier and thus the substrate pass through each pair of front and back menisci 130 in close proximity to the front and back menisci so as to conduct the substrate processing operation.

It should be appreciated that depending on the type of fluid applied to the semiconductor wafer 102, the fluid meniscus 116 generated by the proximity head 110' on the substrate surface 102 may be any suitable substrate processing operation such as, for example, pre-rinsing, cleaning, drying, etc. In one embodiment, the proximity head 110' includes source inlets 132 and 156 and a source outlet 154. In such an embodiment, isopropyl alcohol vapor in nitrogen gas $IPA/N_2$ 157 may be applied to the substrate surface through a source inlet 152, vacuum 158 may be applied to the substrate surface through a source outlet 154, and a processing fluid may be applied to the substrate surface through a source inlet 156.

In another embodiment, the application of the $IPA/N_2$ 157 and the processing fluid in addition to the application of the vacuum 158 to remove the processing fluid and the $IPA/N_2$ 157 from the substrate surface 102a can generate the fluid meniscus 116. The fluid meniscus 116 may be a fluid layer defined between the proximity head 110' and the substrate surface that can be moved across a substrate surface 102 in a stable and controllable manner. In one embodiment, the fluid meniscus 116 may be defined by a constant application and removal of the processing fluid. The fluid layer defining the fluid meniscus 116 may be any suitable shape and/or size depending on the size, number, shape, and/or pattern of the source inlets 156, source outlets 154, and source inlets 152.

In addition, any suitable flow rates of the vacuum, $IPA/N_2$, vacuum, and the processing fluid may be used depending on the type of fluid meniscus desired to be generated. In yet another embodiment, depending on the distance between the proximity head 110' and the substrate surface, the $IPA/N_2$ may be omitted when generating and utilizing the fluid meniscus 116. In such an embodiment, the proximity head 110' may not include the source inlet 158 and therefore only the application of the processing fluid by the source inlet 156 and the removal of the processing fluid by the source outlet 154 generates the fluid meniscus 116.

In other embodiments of the proximity head 110', the processing surface of the proximity head 110' (the region of the proximity head where the source inlets and source outlets are located) may have any suitable topography depending on the configuration of the fluid meniscus 116 to be generated. In one embodiment, the processing surface of the proximity head may be either indented or may protrude from the surrounding surface.

FIG. 4B shows a top view of a portion of a proximity head 110' in accordance with one embodiment of the present invention. It should be appreciated that the configuration of the proximity head 110' is exemplary in nature. Therefore, other configurations of proximity heads 110' may be utilized to generate the fluid meniscus 116 as long as the processing fluid can be applied to a substrate surface and removed from the substrate surface to generate a stable fluid meniscus 116 on the substrate surface. In addition, as discussed above, other embodiments of the proximity head 110' do not have to have the source inlet 156 when the proximity head 110' is configured to generate the fluid meniscus without usage of $N_2/IPA$.

In the top view of one embodiment, from left to right are a set of the source inlet 152, a set of the source outlet 154, a set of the source inlet 156, a set of the source outlet 154, and a set of the source inlet 152. Therefore, as $N_2$/IPA and processing chemistry are inputted into the region between the proximity head 110' and the substrate surface, the vacuum removes the $N_2$/IPA and the processing chemistry along with any fluid film and/or contaminants that may reside on the semiconductor wafer 102. The source inlets 152, the source inlets 156, and the source outlets 154 described herein may also be any suitable type of geometry such as for example, circular opening, triangle opening, square opening, etc. In one embodiment, the source inlets 152 and 156 and the source outlets 154 have circular openings. It should be appreciated that the proximity head 110' may be any suitable size, shape, and/or configuration depending on the size and shape of the fluid meniscus 116 desired to generated. In one embodiment, the proximity head may extend less than a radius of the substrate. In another embodiment, the proximity head may extend more than the radius of the substrate. In another embodiment, the proximity head may extend greater than a diameter of the substrate. Therefore, the size of the fluid meniscus may be any suitable size depending on the size of a substrate surface area desired to be processed at any given time. In addition, it should be appreciated that the proximity head 110' may be positioned in any suitable orientation depending on the substrate processing operation such as, for example, horizontally, vertically, or any other suitable position in between. The proximity head 110' may also be incorporated into a substrate processing system where one or more types of substrate processing operations may be conducted.

Figure 4C:
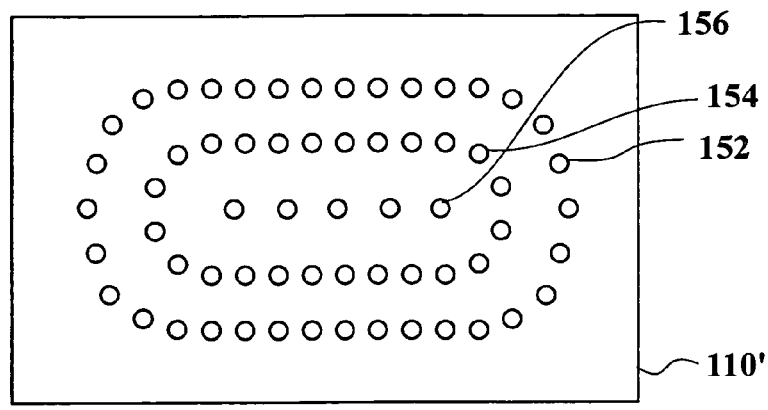
FIG. 4C illustrates another inlets/outlets pattern of a proximity head in accordance with still another embodiment of the present invention.

FIG. 4C illustrates an inlets/outlets pattern of a proximity head 110' in accordance with one embodiment of the present invention. In this embodiment, the proximity head 110' includes the source inlets 152 and 156 as well as source outlets 154. In one embodiment, the source outlets 154 may surround the source inlets 156 and the source inlets 152 may surround the source outlets 154.

Figure 4D:
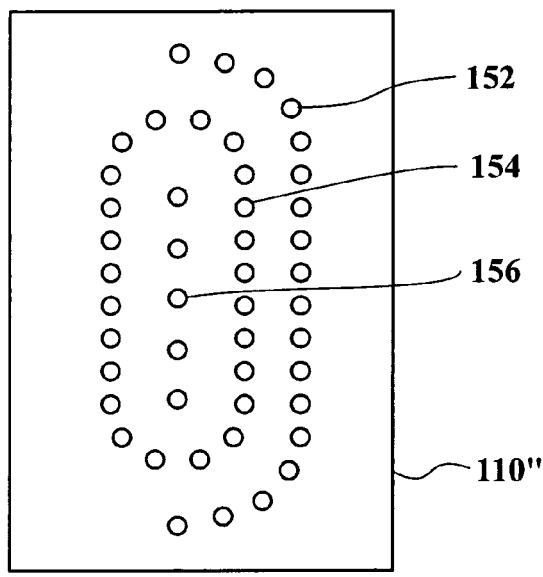
FIG. 4D illustrates a further inlets/outlets pattern of a proximity head in accordance with yet another embodiment of the present invention.

FIG. 4D illustrates another inlets/outlets pattern of a proximity head 110' in accordance with one embodiment of the present invention. In this embodiment, the proximity head 110' includes the source inlets 152 and 156 as well as source outlets 154. In one embodiment, the source outlets 154 may surround the source inlets 156 and the source inlets 152 may at least partially surround the source outlets 154.

Figure 4E:
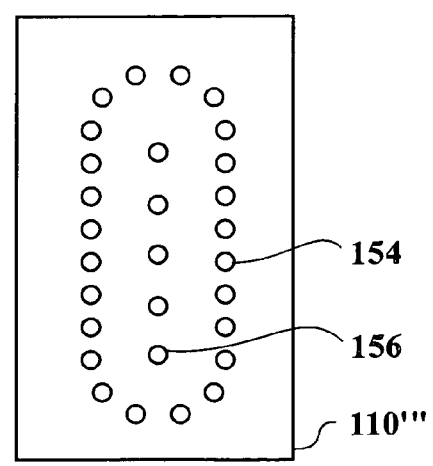
FIG. 4E illustrates a further inlets/outlets pattern of a proximity head in accordance with yet another embodiment of the present invention.

FIG. 4E illustrates a further inlets/outlets pattern of a proximity head 110' in accordance with one embodiment of the present invention. In this embodiment, the proximity head 110' includes the source inlets 152 and 156 as well as source outlets 154. In one embodiment, the source outlets 154 may surround the source inlets 156. In one embodiment, the proximity head 110' does not include source inlets 152 because, in one embodiment, the proximity head 110' is capable of generating a fluid meniscus without application of IPA/$N_2$. It should be appreciated that the above described inlets/outlets patterns are exemplary in nature and that any suitable type of inlets/outlets patterns may be used as long as a stable and controllable fluid meniscus can be generated. In one embodiment, depending on how close the proximity head is to the surface being processed, IPA may not be utilized and only processing fluid inlets and vacuum outlets can be used to generate the fluid meniscus. Such an embodiment is described in further detail in reference to U.S. application Ser. No. 10/882,835 entitled "Method And Apparatus For Processing Wafer Surfaces Using Thin, High Velocity Fluid Layer" which is hereby incorporated by reference in its entirety.

For additional information about the proximity vapor clean and dry system, reference can be made to an exemplary system described in the U.S. Pat. No. 6,488,040, issued on Dec. 3, 2002, having inventors John M. de Larios, Mike Ravkin, Glen Travis, Jim Keller, and Wilbur Krusell, and entitled "CAPILLARY PROXIMITY HEADS FOR SINGLE WAFER CLEANING AND DRYING." This U.S. Patent Application, which is assigned to Lam Research Corporation, the assignee of the subject application, is incorporated herein by reference.

For additional information with respect to the proximity head, reference can be made to an exemplary proximity head, as described in the U.S. Pat. No. 6,616,772, issued on Sep. 9, 2003, having inventors John M. de Larios, Mike Ravkin, Glen Travis, Jim Keller, and Wilbur Krusell, and entitled "METHODS FOR WAFER PROXIMITY CLEANING AND DRYING." This U.S. Patent Application, which is assigned to Lam Research Corporation, the assignee of the subject application, is incorporated herein by reference.

For additional information about top and bottom menisci, reference can be made to the exemplary meniscus, as disclosed in U.S. patent application Ser. No. 10/330,843, filed on Dec. 24, 2002, having inventor Carl Woods, and entitled "MENISCUS, VACUUM, IPA VAPOR, DRYING MANIFOLD." This U.S. Patent Application, which is assigned to Lam Research Corporation, the assignee of the subject application, is incorporated herein by reference.

For additional information about top and bottom menisci, vacuum, and IPA vapor, reference can be made to the exemplary system, as disclosed in U.S. patent application Ser. No. 10/330,897, filed on Dec. 24, 2002, having inventor Carl Woods, and entitled "SYSTEM FOR SUBSTRATE PROCESSING WITH MENISCUS, VACUUM, IPA VAPOR, DRYING MANIFOLD." This U.S. Patent Application, which is assigned to Lam Research Corporation, the assignee of the subject application, is incorporated herein by reference.

For additional information about proximity processors, reference can be made to the exemplary processor, as disclosed in U.S. patent application Ser. No. 10/404,270, filed on Mar. 31, 2003, having inventors James P. Garcia, Mike Ravkin, Carl Woods, Fred C. Redeker, and John M. de Larios, and entitled "VERTICAL PROXIMITY PROCESSOR." This U.S. Patent Application, which is assigned to Lam Research Corporation, the assignee of the subject application, is incorporated herein by reference.

For additional information about front and back menisci, reference can be made to the exemplary dynamic meniscus, as disclosed in U.S. patent application Ser. No. 10/404,692, filed on Mar. 31, 2003, having inventors James P. Garcia, John M. de Larios, Michael Ravkin, and Fred C. Redeker, and entitled "METHODS AND SYSTEMS FOR PROCESSING A SUBSTRATE USING A DYNAMIC LIQUID MENISCUS." This U.S. Patent Application, which is assigned to Lam Research Corporation, the assignee of the subject application, is incorporated herein by reference.

For additional information about meniscus, reference can be made to the exemplary dynamic liquid meniscus, as disclosed in U.S. patent application Ser. No. 10/603,427, filed on Jun. 24, 2003, having inventors Carl A. Woods, James P. Garcia, and John M. de Larios, and entitled "METHODS AND SYSTEMS FOR PROCESSING A BEVEL EDGE SUBSTRATE USING A DYNAMIC LIQUID MENISCUS." This U.S. Patent Application, which is assigned to Lam Research Corporation, the assignee of the subject application, is incorporated herein by reference.

For additional information about proximate cleaning and/or drying, reference can be made to the exemplary wafer process, as disclosed in U.S. patent application Ser. No. 10/606,022, filed on Jun. 24, 2003, having inventors John M. Boyd, John M. de Larios, Michael Ravkin, and Fred C. Redeker, and entitled "SYSTEM AND METHOD FOR INTEGRATING IN-SITU METROLOGY WITHIN A WAFER PROCESS." This U.S. Patent Application, which is assigned to Lam Research Corporation, the assignee of the subject application, is incorporated herein by reference.

For additional information about depositing and planarizing thin films of semiconductor substrates, reference can be made to the exemplary apparatus and method, as disclosed in U.S. patent application Ser. No. 10/607,611, filed on Jun. 27, 2003, having inventors John Boyd, Yezdi N. Dordi, and John M. de Larios, and entitled "APPARATUS AND METHOD FOR DEPOSITING AND PLANARIZING THIN FILMS OF SEMICONDUCTOR WAFERS." This U.S. Patent Application, which is assigned to Lam Research Corporation, the assignee of the subject application, is incorporated herein by reference.

For additional information about cleaning a substrate using megasonic cleaning, reference can be made to the exemplary method and apparatus, as disclosed in U.S. patent application Ser. No. 10/611,140, filed on Jun. 30, 2003, having inventors John M. Boyd, Mike Ravkin, Fred C. Redeker, and John M. de Larios, and entitled "METHOD AND APPARATUS FOR CLEANING A SUBSTRATE USING MEGASONIC POWER." This U.S. Patent Application, which is assigned to Lam Research Corporation, the assignee of the subject application, is incorporated herein by reference.

For additional information about proximity brush cleaning, reference can be made to the exemplary proximity brush, as disclosed in U.S. patent application Ser. No. 10/742,303, filed on Dec. 18, 2003, having inventors John M. Boyd, Michael L. Orbock, and Fred C. Redeker, and entitled "PROXIMITY BRUSH UNIT APPARATUS AND METHOD." This U.S. Patent Application, which is assigned to Lam Research Corporation, the assignee of the subject application, is incorporated herein by reference.

Various proximity heads and methods of using the proximity heads are described in co-owned U.S. patent application Ser. No. 10/834,548 filed on Apr. 28, 2004 and entitled "APPARATUS AND METHOD FOR PROVIDING A CONFINED LIQUID FOR IMMERSION LITHOGRAPHY," which is a continuation in part of U.S. patent application Ser. No. 10/606,022, filed on Jun. 24, 2003 and entitled "SYSTEM AND METHOD FOR INTEGRATING IN-SITU METROLOGY WITHIN A WAFER PROCESS." Additional embodiments and uses of the proximity head are also disclosed in U.S. patent application Ser. No. 10/404,692, filed on Mar. 31, 2003, entitled "METHODS AND SYSTEMS FOR PROCESSING A SUBSTRATE USING A DYNAMIC LIQUID MENISCUS." Additional information with respect to proximity cleaning can be found in U.S. patent application Ser. No. 10/817,355 filed on Apr. 1, 2004 entitled "SUBSTRATE PROXIMITY PROCESSING STRUCTURES AND METHODS FOR USING AND MAKING THE SAME," U.S. patent application Ser. No. 10/817,620 filed on Apr. 1, 2004 entitled "SUBSTRATE MENISCUS INTERFACE AND METHODS FOR OPERATION," and U.S. patent application Ser. No. 10/817,133 filed on Apr. 1, 2004 entitled "PROXIMITY MENISCUS MANIFOLD." The aforementioned patent applications are hereby incorporated by reference in their entirety.

Additional embodiments and uses of the proximity head are also disclosed in U.S. patent application Ser. No. 10/330,897, filed on Dec. 24, 2002, entitled "System for Substrate Processing with Meniscus, Vacuum, IPA vapor, Drying Manifold" and U.S. patent application Ser. No. 10/404,270, filed on Mar. 31, 2003, entitled "Vertical Proximity Processor," U.S. patent application Ser. No. 10/817,398 filed on Apr. 1, 2004 entitled "Controls of Ambient Environment During Wafer Drying Using Proximity Head," U.S. Pat. No. 6,488,040, issued on Dec. 3, 2002, entitled "Capillary Proximity Heads For Single Wafer Cleaning And Drying," and U.S. Pat. No. 6,616,772, issued on Sep. 9, 2003, entitled "Methods For Wafer Proximity Cleaning And Drying." Still further, additional embodiments and uses of the proximity head are described in U.S. patent application Ser. No. 10/883,301 entitled "Concentric Proximity Processing Head," and U.S. patent application Ser. No. 10/882,835 entitled "Method and Apparatus for Processing Wafer Surfaces Using Thin, High Velocity Fluid Layer." Further embodiments and uses of the proximity head are further described in U.S. patent application Ser. No. 10/957,260 entitled "Apparatus And Method For Processing A Substrate," U.S. patent application Ser. No. 10/956,799 entitled "Apparatus And Method For Utilizing A Meniscus In Substrate Processing" and U.S. patent application Ser. No. 10/957,384 entitled "Phobic Barrier Meniscus Separation And Containment." The aforementioned patent applications are hereby incorporated by reference in their entirety.

Although the foregoing invention has been described in some detail for purposes of clarity of understanding, it will be apparent that certain changes and modifications may be practiced within the scope of the appended claims. For example, the embodiments of the present invention can be implemented to clean any substrate having varying sizes and shapes such as those employed in the manufacture of semiconductor devices, flat panel displays, hard drive discs, flat panel displays, and the like. Additionally, the present embodiments are to be considered as illustrative and not restrictive, and the invention is not to be limited to the details given herein, but may be modified within the scope and equivalents of the appended claims.

What is claimed is:

1. An apparatus for preparing a substrate, the apparatus comprising:

a proximity head configured to be applied to a substrate frontside, the proximity head capable of generating a preparation meniscus on the substrate frontside, the preparation meniscus including a preparation chemistry configured to remove a material defined on the substrate frontside; and a megasonic proximity head configured to be applied to a substrate backside, the megasonic proximity head capable of generating a coupling meniscus from a fluid on the substrate backside, the megasonic proximity head further capable of imparting megasonic energy to the coupling meniscus, the megasonic proximity head including, (a) a housing having inlets that define channels from the fluid into a well of the housing, the well being defined by sidewalls of the housing and a base surface, the channels defined in the housing so as to be directed into the well; and (b) a transducer defined in the housing at an area beneath the well and under the base surface;

(c) a top surface of the housing defined around the well, the top surface defined to face closest to the substrate backside, and the top surface having a channel outside and around the well, the channel coupled to an outlet for removing the fluid from the well through the megasonic proximity head, and the top surface being spaced apart from the base surface of the well, such that the well resides in the housing that is defined to face the substrate backside;

wherein the megasonic energy imparted to the coupling meniscus is configured to enhance a mass transport of the preparation chemistry through a material to be removed on the substrate frontside.

2. The apparatus as recited in claim 1, wherein the housing of the megasonic proximity head includes a channel defined at a backside of the transducer, the channel defined in proximity to the backside of the transducer.

3. The apparatus as recited in claim 2, wherein the channel defined at the backside of the transducer is coupled to a cooling source.

4. The apparatus as recited in claim 2, further comprising,
a sensor oriented and coupled beside the proximity head, the sensor defined for inspection of the processing of the substrate frontside.

5. The apparatus as recited in claim 1, wherein the substrate is configured to attenuate a portion of the megasonic energy imparted to the substrate through the coupling meniscus.

6. The apparatus as recited in claim 1, wherein the material to be removed is a layer of material defined over the substrate or a particulate contaminant.

7. The apparatus as recited in claim 3, further comprising,
an additional resonator defined beside sidewalls of the channels of the housing, the additional resonator defined to impart energy to the coupling meniscus as it is directed toward and into the well.

8. The apparatus as recited in claim 1, wherein the proximity head and the megasonic proximity head are arranged one opposite the other, and each of the proximity head and the megasonic proximity head extend at least a width of the substrate.

9. The apparatus as recited in claim 1, wherein the proximity head does not include a transducer.

10. A substrate preparation system, the system comprising:
a proximity head configured to be applied to a substrate frontside, the proximity head capable of generating a preparation meniscus on the substrate frontside, the preparation meniscus including a preparation chemistry configured to remove a material to be removed defined on the substrate frontside, the proximity head not including a top-side resonator; and
a megasonic proximity head configured to be applied to a substrate backside, the megasonic proximity head capable of generating megasonic energy, wherein the megasonic proximity head includes,
a resonator having a first side and a second side, the first side of the resonator facing the substrate backside and disposed in a housing of the megasonic proximity head, the resonator positioned in a well defined in the housing of the megasonic proximity head;
a plurality of channels disposed in the housing of the megasonic proximity head, each of the channels having a first end coupled to a source for communicating fluid and each of the channels having a second end directed into the well of the housing, such that fluid is capable of flowing inside the well by the oriented direction of the second end of the plurality of channels;
a channel defined in the housing and surrounding the well of the housing, the channel defined to output fluid out of the well through an outlet defined in the housing of the megasonic proximity head, and
a crystal defined on the second side of the resonator wherein a vibration of the crystal is configured to generate megasonic energy,
wherein the megasonic energy is configured to enhance a mass transport of the preparation chemistry through the material to be removed.

11. The system as recited in claim 10, wherein the megasonic energy generated by the vibration of the crystal is imparted to the substrate through a back meniscus generated by the megasonic proximity head.

12. The system as recited in claim 10, wherein the housing of the megasonic proximity head includes a channel defined at a backside and defined in temperature conducting proximity to the crystal.

13. The system as recited in claim 10, wherein the channel defined at the backside of the transducer is coupled to a cooling source.

14. The system as recited in claim 10, wherein the cooling source provides cooled fluid.

15. The system as recited in claim 10, wherein further comprising,
a sensor oriented and coupled beside the proximity head, the sensor defined for inspection of the processing of the substrate frontside.

16. The system as recited in claim 14, further comprising,
an additional resonator defined beside sidewalls of ones of the plurality of channels of the housing, the additional resonator defined to impart energy to the cooled fluids is directed toward and into the well.

* * * * *